United States Patent [19]

Lee et al.

[11] Patent Number: 4,566,026
[45] Date of Patent: Jan. 21, 1986

[54] INTEGRATED CIRCUIT BIMETAL LAYER

[75] Inventors: Ed C. Lee, Bloomington; Jon A. Roberts, Minnetonka, both of Minn.

[73] Assignee: Honeywell Inc., Minneapolis, Minn.

[21] Appl. No.: 603,862

[22] Filed: Apr. 25, 1984

[51] Int. Cl.⁴ .................. H01L 23/48; B05D 5/12
[52] U.S. Cl. .................................. 357/71; 357/67; 357/65; 427/89
[58] Field of Search ............... 357/71, 67, 65; 427/89, 427/90

[56] References Cited

FOREIGN PATENT DOCUMENTS 0211269 12/1982 Japan ...................................... 357/71

OTHER PUBLICATIONS

Applied Physics Letters, vol. 23, #2, 7/15/73, by Bower, pp. 99-101.
Thin Solid Films, #96, 4/8/82, pp. 301-316, by Ho.
Thin Solid Films, #73, 4/25/80, pp. 245-254, by Jamal et al.
Journal of Electrochemical Society; Solid State Science & Tech., May 1983, by Suni et al.
Paper of the Intl. Conference on Metallurgical Coatings, San Diego, Calif., Apr. 23-27, 1979, pp. 191-203.
Journal of Vacuum Science Technology, vol. 21, May/-Jun. 1982, pp. 14-18, by Ting.
Thin Solid Films, #96, 1982, pp. 327-345, by Ting.
IEEE Transactions on Electron Devices, vol. 27, #4, Apr. 1980, pp. 873-876, by Seefeld.
Applied Physics Letters, vol. 36, Mar. 15, 1980, pp. 456-458, by Wittmer.
Thin Solid Films, #93, 1982, pp. 397-405, by Wittmer.
Journal of Applied Physics, Mar. 1983, pp. 1423-1428, by Wittmer.

Primary Examiner—Andrew J. James
Assistant Examiner—Mark Prenty
Attorney, Agent, or Firm—John P. Sumner

[57] ABSTRACT

Disclosed is a bimetal layer located between two portions of an integrated circuit, the bimetal layer comprising a layer of TiWN and a layer of TiN.

25 Claims, 1 Drawing Figure

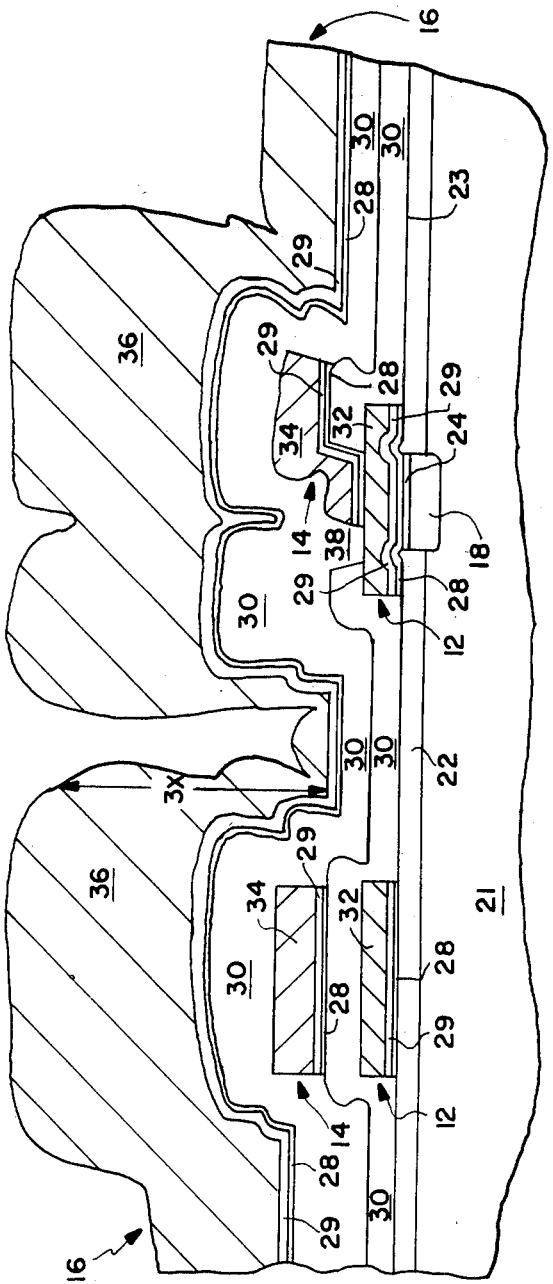

INTEGRATED CIRCUIT BIMETAL LAYER

The Government has rights in this invention pursuant to Contract No. F33615-81-C-1527 awarded by the Department of the Air Force.

BACKGROUND AND SUMMARY OF THE INVENTION

Common metalization schemes for silicon based integrated circuits comprise multilayer contact structures. Such structures typically include aluminum or aluminum/copper metalization layers serving as electrical conductors. The semiconductor devices in such circuits require protection against aluminum or aluminum/copper interdiffusion or spiking into the silicon substrate. Further, silicon based devices require protection against mobile ion contamination.

The present invention relates to providing protection against both the aluminum or aluminum/copper spiking and against mobile ion contamination. The present invention provides this protection while allowing normal processing to be done on multilayer metal structures.

Specifically the present invention comprises a bimetal layer located between two portions of an integrated circuit, the bimetal layer comprising a layer of TiWN and a layer of TiN.

Prior art disclosures separately address the nitriding of TiW or Ti as a barrier metal against spiking, and also separately address the possibility of using Ti as a barrier against mobile ion contamination. However, the reaction of Ti with Si has prohibited the use of Ti alone. The present invention uses TiN instead of Ti and adds TiWN to satisfy both requirements.

BRIEF DESCRIPTION OF THE DRAWING

The FIGURE illustrates an integrated circuit comprising the present invention.

DESCRIPTION OF THE PREFERRED EMBODIMENT

The FIGURE illustrates an integrated circuit comprising three metalization layers 12, 14, and 16. (For the purpose of the present application, metalization layers may comprise more than one layer of metal; thus, for example, each metalization layer 12, 14, and 16 may comprise a layer of aluminum or aluminum/copper as typically found in the prior art and may also comprise the bimetal layer of the present invention.)

Metalization layers such as 12, 14, and 16 may comprise contact pads or may comprise interconnects used to connect various portions of an integrated circuit including devices such as 18 located within a device substrate. A device substrate may comprise a layer of semiconductor material 21 such as silicon and a dielectric layer 22 such as silicon dioxide formed on a major surface 23 of the substrate. Devices such as 18 are typically formed in dielectric layer 22. A first layer of metalization such as 12 is typically formed over major surface 23.

In the case of devices comprising a layer 22 of $SiO_2$, a thin layer 24 of $Pd_2Si$ is typically formed between first metal layer 12 and device 18. This layer of $Pd_2Si$ typically serves the purpose of enhancing the ohmic contact between the metalization layer and the device.

In accordance with the present invention, the aluminum or aluminum/copper portion 32, 34 and 36 of each metalization layer 12, 14 and 16 respectively is separated from the integrated circuit portion below it by the bimetal layer of the present invention, i.e. by a layer comprising a layer 29 of TiWN and a layer 28 of TiN. In the preferred embodiment of the present invention, layer 28 of TiN is relatively thin, e.g., in the range of 200 angstroms through approximately 500 angstroms, although any thickness desired may be used. The thickness of the TiWN layer 28 is typically on the order of 1,000 angstroms although any desired thickness may also be used for this layer. Further, in the preferred embodiment of the present invention, layer 28 of TiN is underneath layer 29 of TiWN.

As previously indicated, the bimetal layer of the present invention is located between two portions of an integrated circuit. For example, the present invention may be located between an aluminum or aluminum/copper layer such as 32 and a semiconductor device such as 18. As also previously indicated, the purpose of the present invention in such a location is to prevent spiking of the aluminum or aluminum/copper composition of portion 32 of metalization 12 from contaminating device 18 which typically comprises silicon. Note that as indicated in the FIGURE it is not unusual to place a layer 24 of $Pd_2Si$ between device 18 and metalization 12; as previously indicated, this $Pd_2Si$ layer 24 enhances ohmic contact to the device.

The bimetal layer of the present invention may also be located between an aluminum or aluminum/copper layer such as 32, 34, or 36 and a dielectric layer such as 22 or 30. At such a location, the present invention serves as an etch stop during the plasma etching of the aluminum or aluminum/copper since TiN does not etch in plasmas such as chlorine commonly used for delineating the pattern of metalizations such as 12, 14, and 16. This aspect of the present invention has an advantage over similar approaches in the prior art. One approach in the prior art was to use TiW as a barrier metal. However, when TiW is nitrided to form TiWN, it deprives the material from functioning as an etch stop. However, inasmuch as TiN is an effective etch stop in a plasma environment, the TiN not only serves as a barrier against mobile ion contamination but also as an etch stop. This etch stop feature of the present invention allows normal processing to be done on multilayer metalization structures while also achieving the protection against aluminum or aluminum/copper spiking and against mobile ion contamination.

The bimetal layer of the present invention may also be located between layers of aluminum or aluminum/copper, e.g., between layer 32 and 34 in the region of oversized via 38. At such a location, the TiN layer 28 comprising the present invention serves as an etch stop in forming the second layer of metal 14 at this location.

This etch stop feature is also important during the etch of a region which might comprise a thickness of metal two or three times the thickness of the normal metalization coverage (see, for example, the thickness labelled 3X in the FIGURE). If the present invention did not comprise an etch stop, the etching of third metal layer 36 in the region of nominal thickness would not be stopped by TiN layer 28. For example, if the present invention did not comprise TiN layer 28, a chlorine etching process used in removing the 3X region in the FIGURE would not only attack metalization layer 36 but also those portions of dielectric layer 30 and, perhaps, second metalization layer 34 located below those portions of layer 36 that are of nominal thickness.

In fabricating devices comprising the present invention, layer 28 of TiN may be formed by reactively sputtering a Ti target in Ar with a 10% partial pressure of nitrogen at a total pressure of 10 mTorr and an RF power of 6.5 w/cm$^2$. Without breaking the vacuum, wafers may then be transferred to a TiW target. There the TiW may be reactively sputtered with a 50% partial pressure of nitrogen in Ar at a total pressure of 10 mTorr. For this portion of the process, a DC power on the order of 6.5 w/cm$^2$ may be used.

The resulting multilayer barrier metal 28, 29 is etchable in a plasma of BCl$_3$ followed by CF$_4$ plus oxygen plasma (TiWN etches in a chlorine containing plasma; TiN etches in a fluorine plasma).

The reason that it is preferred to make layer 28 of TiN relatively thin (in the 200–500 angstrom range as previously indicated) is that a gas such as CF$_4$ used to plasma etch the TiN layer will also typically etch any SiO$_2$ layer below layer 28; accordingly by making layer 28 thin, it can be quickly etched away without injury to the dielectric layer below it.

All other portions of integrated circuits comprising the present invention may be fabricated using standard processes, dimensions and materials or other processes, dimensions and materials as desired. Further, those skilled in the art will recognize that many other processes to fabricate layers 28 and 29 of the present invention are also possible.

The present invention is to be limited only in accordance with the scope of the appended claims, since others skilled in the art may devise other embodiments still within the limits of the claims. For example, locations of the present invention other than those illustrated in the FIGURE are possible. Further, those skilled in the art will also recognize that many other variations, both in processing and structure, are also possible in addition to those disclosed.

The embodiments of the invention in which an exlcusive property or right is claimed are defined as follows:

1. A bimetal layer located between a metalization layer and a semiconductor device in an integrated circuit, the bimetal layer comprising a layer of TiWN and a layer of TiN, wherein one of the TiWN and TiN layers is deposited above the other.

2. The apparatus of claim 1 wherein the layer of TiN is located between the layer of TiWN and the semiconductor device.

3. The apparatus of claim 2 where a layer of Pd$_2$Si is located between the layer of TiN and the semiconductor device.

4. The apparatus of claim 3 wherein the metalization layer comprises aluminum and wherein the semiconductor device comprises silicon.

5. The apparatus of claim 4 wherein the TiN layer has a thickness in the range of approximately 200 angstroms through approximately 500 angstroms.

6. The apparatus of claim 1 where a layer of Pd$_2$Si is located between the bimetal layer and the semiconductor device.

7. The apparatus of claim 6 wherein the metalization layer comprises aluminum and wherein the semiconductor device comprises silicon.

8. The apparatus of claim 7 wherein the TiN layer has a thickness in the range of approximately 200 angstroms through approximately 500 angstroms.

9. The apparatus of claim 1 wherein the metalization layer comprises aluminum and wherein the semiconductor device comprises silicon.

10. The apparatus of claim 9 wherein the TiN layer has a thickness in the range of approximately 200 angstroms through approximately 500 angstroms.

11. The apparatus of claim 1 wherein the TiN layer has a thickness in the range of approximately 200 angstroms through approximately 500 angstroms.

12. A bimetal layer located between a metalization layer and a dielectric layer in an integrated circuit, the bimetal layer comprising a layer of TiWN and a layer of TiN, wherein one of the TiWN and TiN layers is deposited above the other.

13. The apparatus of claim 12 wherein the layer of TiN is located between the layer of TiWN and the dielectric layer.

14. The apparatus of claim 13 wherein the metalization layer comprises aluminum and wherein the dielectric layer comprises an oxide of silicon.

15. The apparatus of claim 14 wherein the TiN layer has a thickness in the range of approximately 200 angstroms through approximately 500 angstroms.

16. The apparatus of claim 12 wherein the metalization layer comprises aluminum and wherein the dielectric layer comprises an oxide of silicon.

17. The apparatus of claim 16 wherein the TiN layer has a thickness in the range of approximately 200 angstroms through approximately 500 angstroms.

18. The apparatus of claim 12 wherein the TiN layer has a thickness in the range of approximately 200 angstroms through approximately 500 angstroms.

19. A bimetal layer located between two metalization layers in an integrated circuit, the bimetal layer comprising a layer of TiWN and a layer of TiN, wherein one of the TiWN and TiN layers is deposited above the other.

20. The apparatus of claim 19 wherein the layer of TiN is located under the layer of TiWN.

21. The apparatus of claim 20 wherein each of the metalization layers comprise aluminum.

22. The apparatus of claim 21 wherein the TiN layer has a thickness in the range of approximately 200 angstroms through approximately 500 angstroms.

23. The apparatus of claim 21 wherein each of the metalization layers comprise aluminum.

24. The apparatus of claim 23 wherein the TiN layer has a thickness in the range of approximately 200 angstroms through approximately 500 angstroms.

25. The apparatus of claim 19 wherein the TiN layer has a thickness in the range of approximately 200 angstroms through approximately 500 angstroms.

* * * * *